United States Patent
Park et al.

(10) Patent No.: US 6,969,886 B1
(45) Date of Patent: Nov. 29, 2005

(54) ONO FABRICATION PROCESS FOR REDUCING OXYGEN VACANCY CONTENT IN BOTTOM OXIDE LAYER IN FLASH MEMORY DEVICES

(75) Inventors: Jaeyong Park, Sunnyvale, CA (US); Hidehiko Shiraiwa, San Jose, CA (US); Arvind Halliyal, Cupertino, CA (US); Jean Y. Yang, Sunnyvale, CA (US); Inkuk Kang, Saratoga, CA (US); Tazrien Kamal, San Jose, CA (US); Amir H. Jafarpour, Pleasanton, CA (US)

(73) Assignee: FASL, LLC, Sunnyvale, CA (US)

( * ) Notice: Subject to any disclaimer, the term of this patent is extended or adjusted under 35 U.S.C. 154(b) by 0 days.

(21) Appl. No.: 10/889,424

(22) Filed: Jul. 12, 2004

Related U.S. Application Data

(62) Division of application No. 10/308,518, filed on Dec. 3, 2002, now Pat. No. 6,803,275.

(51) Int. Cl.$^7$ .......................................... H01L 31/119
(52) U.S. Cl. ...................... 257/324; 257/325; 257/410; 257/411
(58) Field of Search ...................... 257/321, 324–326, 257/410, 411, 390; 438/216, 261, 591, 593

(56) References Cited

U.S. PATENT DOCUMENTS

| | | | |
|---|---|---|---|
| 4,784,975 A | 11/1988 | Hoffmann et al. | 438/308 |
| 6,236,064 B1 | 5/2001 | Mase et al. | 257/72 |
| 6,281,142 B1 | 8/2001 | Basceri et al. | 438/771 |
| 6,337,237 B1 | 1/2002 | Basceri et al. | 438/239 |
| 6,348,380 B1 | 2/2002 | Weimer et al. | 438/257 |
| 6,420,192 B2 | 7/2002 | Miki et al. | 438/3 |
| 6,436,757 B1 | 8/2002 | Kitamura | 438/240 |
| 2001/0038881 A1 | 11/2001 | Welsch et al. | 427/79 |
| 2002/0084480 A1* | 7/2002 | Basceri et al. | 257/306 |
| 2002/0086476 A1 | 7/2002 | Kim et al. | 438/200 |

OTHER PUBLICATIONS

Lenahan et al.; "Radiation-Induced Leakage Currents: Atomic Scale Mechanisms"; IEEE Transactions on Nuclear Science; vol. 48, No. 6, Dec. 2001.

* cited by examiner

*Primary Examiner*—Minh-Loan Tran
(74) *Attorney, Agent, or Firm*—Renner, Otto, Boisselle & Sklar, LLP

(57) ABSTRACT

A SONOS flash memory device, including a semiconductor substrate; an ONO structure formed on the semiconductor substrate, the ONO structure including a bottom oxide layer, a dielectric charge storage layer and a top oxide layer, the bottom oxide layer having a super-stoichiometric oxygen content and an oxygen vacancy content of about $10^{10}/cm^2$ or less, wherein the bottom oxide layer exhibits a reduced charge leakage relative to a bottom oxide layer having a stoichiometric or sub-stoichiometric oxygen content and a greater number of oxygen vacancies. In one embodiment, the bottom oxide layer has an oxygen vacancy content of substantially zero.

20 Claims, 4 Drawing Sheets

ONO FABRICATION PROCESS FOR REDUCING OXYGEN VACANCY CONTENT IN BOTTOM OXIDE LAYER IN FLASH MEMORY DEVICES

CROSS-REFERENCE TO RELATED APPLICATION

This application is a division of and claims priority under 35 U.S.C. §120 to commonly assigned U.S. application Ser. No. 10/308,518, filed 3 Dec., 2002 now U.S. Pat. No. 6,803,275.

TECHNICAL FIELD

The present invention relates to a process for preparation of a SONOS flash memory device including an ONO structure in which the bottom oxide layer exhibits reduced charge leakage. The bottom oxide layer is provided with increased oxygen content and/or reduced oxygen vacancy content.

BACKGROUND ART

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased. Flash EEPROM devices are similar to EEPROM devices in that memory cells can be programmed and erased electrically. However, flash EEPROM devices enable the erasing of all memory cells in the device using a single electrical current pulse.

Product development efforts in EEPROM device technology have focused on increasing the programming speed, lowering programming and reading voltages, increasing data retention time, reducing cell erasure times and reducing cell dimensions. One important dielectric material for the fabrication of the EEPROM is an oxide-nitride-oxide (ONO) structure. One EEPROM device that utilizes the ONO structure is a silicon-oxide-nitride-oxide-silicon (SONOS) type cell. A second EEPROM device that utilizes the ONO structure is a floating gate FLASH memory device, in which the ONO structure is formed over the floating gate, typically a polysilicon floating gate.

In SONOS devices, during programming, electrical charge is transferred from the substrate to the silicon nitride charge storage layer in the ONO structure. Voltages are applied to the gate and drain creating vertical and lateral electric fields, which accelerate the electrons along the length of the channel. As the electrons move along the channel, some of them gain sufficient energy to jump over the potential barrier of the bottom oxide layer and become trapped in the silicon nitride layer. Electrons are trapped near the drain region because the electric fields are the strongest near the drain. Reversing the potentials applied to the source and drain will cause electrons to travel along the channel in the opposite direction and be injected into the silicon nitride layer near the source region. Because silicon nitride is not electrically conductive, the charge introduced into the silicon nitride layer tends to remain localized. Accordingly, depending upon the application of voltage potentials, electrical charge can be stored in discrete regions within a single continuous silicon nitride charge storage layer.

Non-volatile memory designers have taken advantage of the localized nature of electron storage within a silicon nitride layer and have designed memory circuits that utilize two regions of stored charge within an ONO layer, in addition to storing charge in a single region of the charge storage layer. This type of non-volatile memory device is known as a dual-bit EEPROM, which is available under the trademark MIRRORBIT™ from Advanced Micro Devices, Inc., Sunnyvale, Calif. The MIRRORBIT™ dual-bit EEPROM is capable of storing twice as much information as a conventional EEPROM in a memory array of equal size. A left bit and a right bit are stored in physically different areas of the silicon nitride layer, in left and right regions of each memory cell, respectively. Programming methods are then used that enable the two bits to be programmed and read simultaneously. Each of the two bits of the memory cell can be individually erased by applying suitable erase voltages to the gate and to either the source or drain regions. In recent developments, multi-bit memory cells have been developed, in which more than two bits can be stored in separate regions of a single memory cell.

The control gate electrode is separated from the charge storage layer by a top dielectric layer, and the charge storage layer is separated from the semiconductor substrate (channel region) by the bottom dielectric layer, forming the oxide-nitride-oxide stack, i.e., the ONO structure or layer. As device dimensions continue to be reduced, the electrical thickness of the top and bottom dielectric layers must be reduced accordingly. Previously, this has been accomplished by scaling down the thickness of the ONO layer. However, as the ONO layer is made physically thinner, leakage currents through the ONO layer may increase, which limits the scaling down of the total physical thickness of the ONO layer. Thus, it becomes more and more important to provide high quality oxide layers, and particularly a high quality bottom oxide layer, free of defects such as oxygen vacancies, E' centers and dangling bonds.

Some of the improvements in devices can be addressed through development of materials and processes for fabricating the ONO layer. Recently, development efforts have focused on novel processes for fabrication of the ONO layer. While the recent advances in EEPROM technology have enabled memory designers to double the memory capacity of EEPROM arrays using dual-bit data storage, numerous challenges exist in the fabrication of material layers within these devices. In particular, the bottom oxide layer of the ONO structure must be carefully fabricated to avoid the creation of interface states that could provide charge leakage paths from the charge storage layer into the substrate. Accordingly, advances in ONO fabrication technology are needed to insure proper charge isolation in ONO structures used, for example, in MIRRORBIT™ dual-bit EEPROM devices.

DISCLOSURE OF INVENTION

The present invention, in one embodiment, relates to a process for fabricating a SONOS flash memory device having reduced charge leakage, including: providing a semiconductor substrate; forming a bottom oxide layer of an ONO structure on the semiconductor substrate, wherein the bottom oxide layer has a first oxygen vacancy content; treating the bottom oxide layer to decrease the first oxygen vacancy content to a second oxygen vacancy content; and depositing a dielectric charge-storage layer on the bottom oxide layer.

In another embodiment, the present invention relates to a process for fabricating a SONOS flash memory device having reduced charge leakage, including: providing a semiconductor substrate; forming a bottom oxide layer of an ONO structure on the semiconductor substrate by a highly oxidizing process, wherein the bottom oxide layer has a super-stoichiometric oxygen content and an oxygen vacancy content reduced relative to a bottom oxide layer formed by a conventional process; and depositing a dielectric charge-storage layer on the bottom oxide layer.

In another embodiment, the present invention relates to a SONOS flash memory device, including: a semiconductor substrate; an ONO structure on the semiconductor substrate, the ONO structure including a bottom oxide layer, a dielectric charge storage layer and a top oxide layer, the bottom oxide layer having a super-stoichiometric oxygen content and an oxygen vacancy content of substantially zero, wherein the bottom oxide layer exhibits a reduced charge leakage relative to a bottom oxide layer having a stoichiometric or sub-stoichiometric oxygen content and a substantial number of oxygen vacancies.

Thus, according to the present invention, by providing an increased oxygen content in the bottom oxide layer of the ONO structure in a flash memory device, a bottom oxide layer may be fabricated without creation of interface states resulting from oxygen vacancies, E' centers and dangling bonds, which could provide charge leakage paths from the charge-storage layer. The present invention can be carried out in a cluster tool. The present invention provides advantages such as (1) formation of a bottom oxide layer with a higher oxygen content and a reduced oxygen vacancy content, reduced numbers of E' centers and dangling bonds; (2) allowing selection of any of a number of different methods for obtaining advantage (1); (3) a lower thermal budget; (4) formation of a bottom oxide layer having fewer interface states that could provide charge leakage paths; and (5) formation of an ONO structure with improved charge storage capability. Thus, the present invention provides an advance in ONO fabrication technology, and insures proper charge isolation in ONO structures used in MIRRORBIT™ dual-bit EEPROM devices, while at the same time providing distinct process and economic advantages. Although described in terms of, and particularly applicable to, MIRRORBIT™ dual-bit EEPROM devices, the present invention is broadly applicable to fabrication of any semiconductor device that includes an ONO structure.

Figure 1:
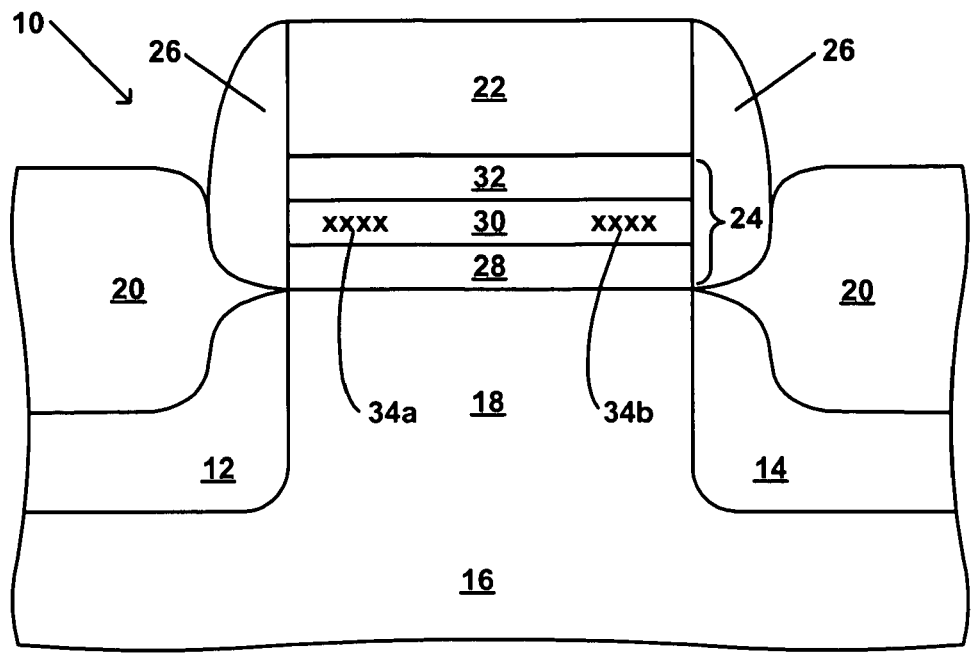
FIG. 1 schematically illustrates, in cross-section, a portion of a semiconductor substrate containing a dual-bit EEPROM transistor which incorporates an ONO structure fabricated in accordance with the invention.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

Furthermore, it should be appreciated that the process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention.

MODES FOR CARRYING OUT THE INVENTION

Referring first to FIG. 1, there is schematically shown in cross-section a transistor 10 suitable for use in a dual-bit EEPROM device, such as the MIRRORBIT™. The transistor 10 includes source/drain regions 12 and 14 located in a semiconductor substrate 16 and separated by a channel region 18. First and second bit line oxide regions 20 overlie source/drain regions 12 and 14, respectively. A gate electrode 22 overlies the channel region 18 and is separated therefrom by an ONO structure 24. Isolation sidewalls 26 are formed on both sides of the ONO structure 24. The gate electrode 22 and the ONO structure 24 form a stacked-gate structure. The ONO structure 24 includes a bottom silicon dioxide layer 28, a charge storage layer 30 and a top oxide layer 32, in that order as shown in FIG. 1. In one embodiment, the charge storage layer 30 comprises silicon nitride. Other suitable dielectric charge storage materials may be used for the charge storage layer 30. As shown in FIG. 1, charges 34a and 34b may be stored in the charge storage layer 30, which acts as a charge or electron storage layer in the SONOS or dual-bit EEPROM device. In other embodiments, either a single charge or more than two charges may be stored in the charge storage layer 30.

The following description of the process of the present invention is described in the context of an ONO structure suitable for use in a dual-bit EEPROM device, such as the MIRRORBIT™ device. It is to be understood that, while the present invention is discussed herein in that context, that this is merely exemplary and is not intended to limit the scope of the present invention. The ONO structure fabricated by the presently disclosed method is applicable to any semiconductor device in which an ONO structure may be included, and may be applicable to a floating gate FLASH device in which an ONO structure forms an interpoly dielectric.

In the operation of the exemplary dual-bit EEPROM transistor 10, voltages are applied to the gate electrode 22 and as appropriate to the source/drain regions 12 and 14. The applied voltages cause electrical charge from the source/drain regions 12 and 14 to propagate across the channel region 18. During programming, once the charge encounters a sufficiently strong vertical field, the charge either is injected or tunnels from the channel region 18 through the bottom oxide layer 28 into the charge storage layer 30. The charge storage layer 30 may also be referred to as an electron storage layer, or ESL. For example, depending upon the particular voltage levels applied to the control-gate electrode 22 and to the source/drain regions 12 and 14, the electrical charges 34a, 34b are transferred into the charge storage layer 30 and are localized to regions in proximity to either the source/drain region 12, or the source/drain region 14.

Those skilled in the art will recognize that for proper functioning of a dual-bit EEPROM device, the electrical charges 34a, 34b should remain isolated in the regions of the charge storage layer 30 to which each charge is initially introduced. The proper maintenance of the electrical charges 34a, 34b in localized regions of the charge storage layer 30 is needed for the proper performance of a dual-bit EEPROM device. Similarly, in a multibit EEPROM device, proper maintenance of the electrical charges in localized regions of the charge storage layer 30 is needed. In particular, the quality of the ONO structure 24 should be such that charge leakage paths through the bottom oxide layer 28 and into the channel region 18 in the substrate 16 are minimized.

In accordance with the invention, charge leakage from the ONO structure 24 to the substrate 16 is minimized by forming a high quality bottom oxide layer 28. The reduced charge leakage and improved dual-bit EEPROM performance obtained by the present invention can be better understood following a description of an ONO fabrication process carried out in accordance with the invention. In the present invention, the bottom oxide layer 28 is provided with an increased quantity or concentration of oxygen relative to that which would normally be present in a conventional bottom oxide layer, by which, inter alia, a high quality bottom oxide layer, having reduced oxygen vacancy content, reduced numbers of E' centers, and/or reduced numbers of dangling bonds (i.e., unshared single electrons or pairs of electrons), is obtained, and charge leakage from the charge storage layer 30 to the substrate 16 or channel region 18 in the flash memory device 10 is reduced.

Herein, the term "oxygen vacancy" may be used to refer to any or all of oxygen vacancies, E' centers, dangling bonds and sub-stoichiometric oxygen content.

Figure 5:
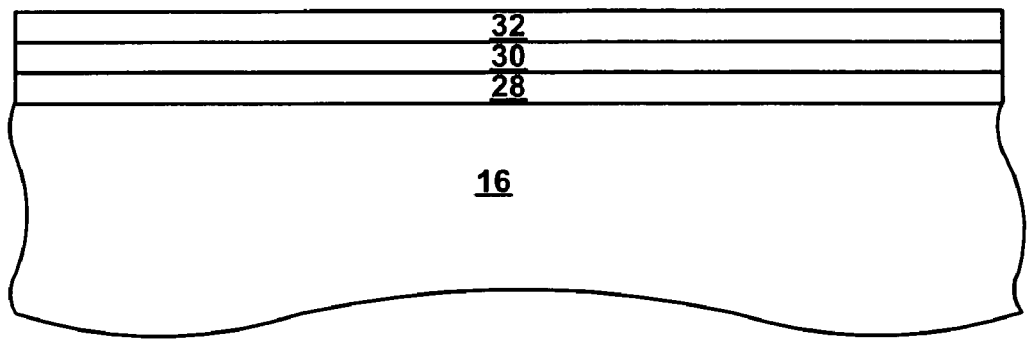
Figure 6:
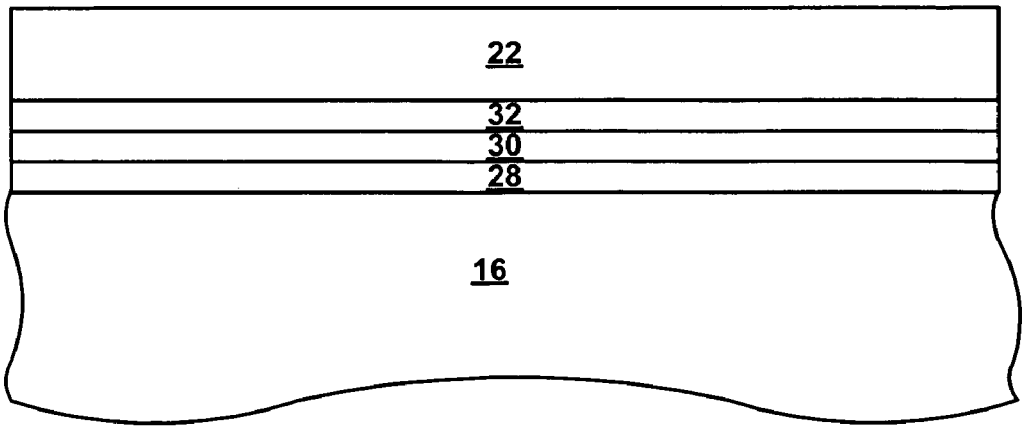
Figure 7:
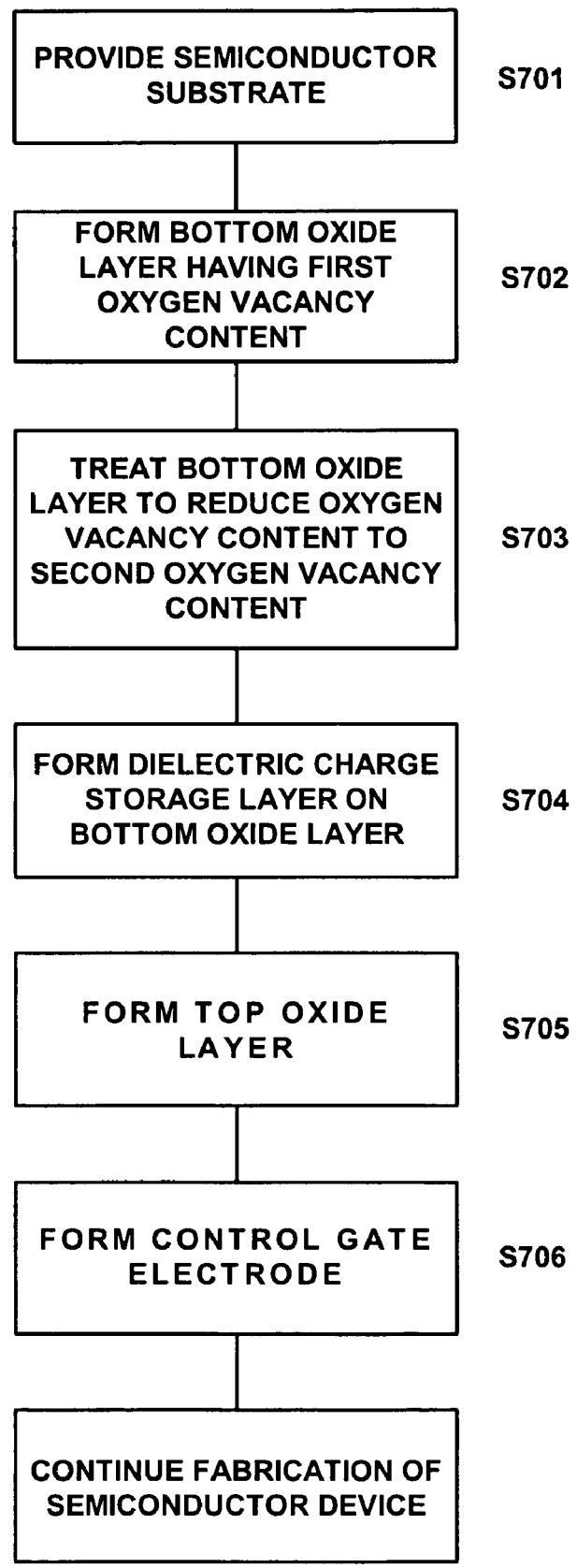
FIG. 7 is a schematic flow diagram showing the steps of one embodiment of the present invention.
Figure 8:
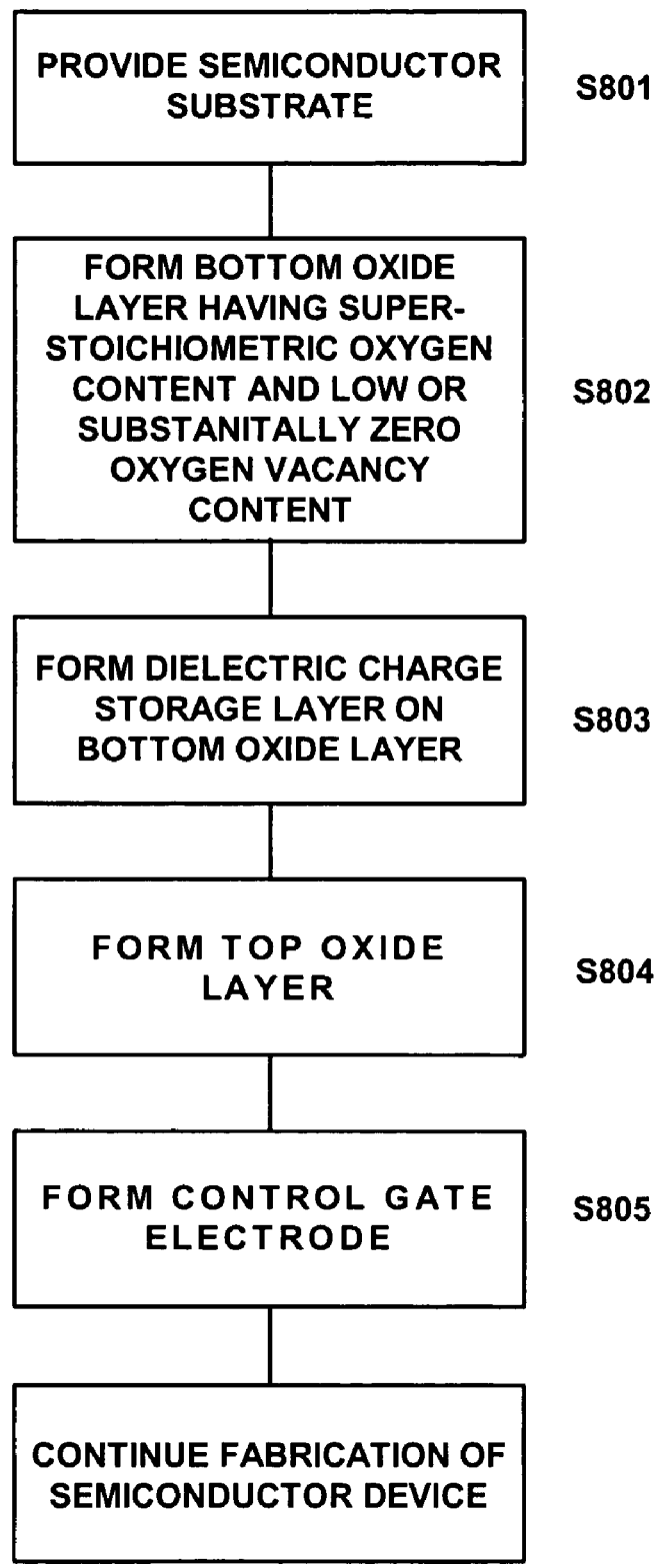
FIG. 8 is a schematic flow diagram showing the steps of another embodiment of the present invention.

The following description of the present invention follows with reference to FIGS. 2–8. FIGS. 2–6 illustrate, in cross-section, process steps for the fabrication of an ONO structure 24 and a gate structure 22 thereover, in accordance with the invention. FIGS. 7 and 8 are schematic flow diagrams showing the steps of two embodiments of processes in accordance with the present invention.

The present invention broadly includes two embodiments. In a first embodiment of the present invention, shown schematically in FIG. 7, a bottom oxide layer 28 is formed by a conventional process to include a first oxygen vacancy content, and is thereafter treated to reduce the oxygen vacancy content from the first oxygen vacancy content to a second oxygen vacancy content. In this embodiment, the bottom oxide layer having the second, reduced oxygen vacancy content exhibits a reduced charge leakage relative to the bottom oxide layer having the first, higher oxygen vacancy content. In one embodiment, the bottom oxide layer having the second, reduced oxygen content has a super-stoichiometric oxygen content.

In a second embodiment of the present invention, shown schematically in FIG. 8, a bottom oxide layer 28 is formed by processes which include strongly oxidizing conditions, which provide the bottom oxide layer 28 with a super-stoichiometric oxygen content and thereby an oxygen vacancy content which is reduced relative to that of a bottom oxide layer made by a conventional process. In one embodiment, the bottom oxide layer 28 is formed having a substantially zero oxygen vacancy content. In one embodiment, the super-stoichiometric oxygen content provides an increased oxygen content relative to the oxygen content in a conventional bottom oxide. In one embodiment, the bottom oxide layer having the super-stoichiometric oxygen content exhibits a reduced charge leakage relative to a conventional bottom oxide layer.

The first step of both embodiments is the same. In the first step of the present invention, shown schematically in FIG. 7 as step 701 and in FIG. 8 as step 801, a semiconductor substrate is provided. The semiconductor substrate maybe any appropriately selected semiconductor substrate known in the art. In one embodiment, the semiconductor substrate 16 is a bulk silicon substrate. In one embodiment, the semiconductor substrate 16 is a silicon-on-insulator (SOI) semiconductor substrate. In one embodiment, the semiconductor substrate 16 is a germanium-on-insulator (GOI) semiconductor substrate. In another embodiment, the semiconductor substrate 16 is a p-doped silicon substrate. Suitable semiconductor substrates include, for example, silicon-on-sapphire (SOS) semiconductor substrates and semiconductor substrates formed of other materials known in the art. The present invention is not limited to any particular type of semiconductor substrate 16.

As disclosed above, the following steps in forming the bottom oxide layer 28 differ between the two embodiments, and each embodiment is described in turn.

The bottom oxide layer 28 may comprise any material known for use as a bottom oxide. The following description generally refers to silicon dioxide; this is merely exemplary, and is not intended to be limiting. In addition to embodiments comprising silicon dioxide, other embodiments of the bottom oxide layer 28 in accordance with the present invention may comprise a high-K dielectric material or a composite dielectric material. In one embodiment, the bottom oxide layer comprises silicon dioxide. In one embodiment, the bottom oxide layer comprises a high-K dielectric material. In one embodiment, the bottom oxide layer comprises a composite dielectric material. In one embodiment, the bottom oxide is substantially free of any high-K dielectric material.

As used herein, the term "high-K dielectric material" refers to a dielectric material having a K of about 10 or more. Such high-K dielectric materials include, for example, $HfO_2$, $ZrO_2$ and others, some of which are identified more fully below. In general, the term "high-K dielectric material" encompasses binary, ternary and higher oxides and any ferroelectric material having a K of about 20 or more. In addition, the high-K dielectric materials include, for example, composite materials such as hafnium silicate, which has a K of about 14, and hafnium silicon oxynitride, which has a K of about 16, depending on the relative content of oxygen and nitrogen, and hafnium silicon nitride, which has a K of about 18.

Suitable high-K dielectric materials include $ZrO_2$, $HfO_2$, $Al_2O_3$, $Y_2O_3$, $La_2O_3$, silicates of one or more of $ZrO_2$, $HfO_2$, $Al_2O_3$, $Y_2O_3$, $La_2O_3$ or aluminates of one or more of $ZrO_2$, $HfO_2$, $Y_2O_3$, $La_2O_3$. Suitable high-K dielectric materials also include tantalum oxide ($Ta_2O_5$), barium titanate (Ba-$TiO_3$), titanium dioxide ($TiO_2$), cerium oxide ($CeO_2$), lanthanum oxide ($La_2O_3$), lanthanum aluminum oxide ($LaAlO_3$), lead titanate ($PbTiO_3$), strontium titanate (Sr-$TiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN (Pb-$Mg_xNb_{1-x}O_3$), PZT ($PbZr_xTi_{1-x}O_3$), PZN ($PbZn_xNb_{1-x}O_3$), and PST ($PbSc_xTa_{1-x}O_3$). In addition to the foregoing high-K dielectrics, other high-K dielectric materials, for example, ferroelectric high-K dielectric materials such as lead lanthanum titanate, strontium bismuth tantalate, bismuth titanate and barium zirconium titanate maybe suitably used in the present invention. Other high-K dielectric materials known in the art, including, for example binary and ternary oxides having K values of about 10 or higher, also may be used in the present invention. In one embodiment, the high-K dielectric material is not tantalum oxide, $Ta_2O_5$, which in some forms may exhibit a high leakage current.

As used herein, the term "composite dielectric material" refers to a dielectric material comprising the elements of at least two other dielectric materials. A composite dielectric material generally has a K value representative of the relative quantities and K values of the components of which the composite dielectric material is comprised. A composite dielectric material may be, for example, a mixed-metal oxide, a metal silicate, a metal aluminate or a metal mixed-aluminate/silicate. Thus, for example, using hafnium as the exemplary metal, the composite dielectric material may be hafnium-zirconium oxide ($Hf_xZr_{1-x}O_2$, where x ranges between 0 and 1), hafnium silicate ($HfSiO_4$), hafnium aluminate ($HfAl_2O_5$) or a hafnium mixed-aluminate/silicate, $HfO_2/SiO_2/Al_2O_3$, which may have a formula such as $Hf_2Si_2Al_2O_{11}$. A composite dielectric material may be formed by co-deposition of its component elements, or by sequential deposition followed by a treatment step, e.g., thermal treatment, to combine the elements to form the composite dielectric material. Suitable metals for the mixed-metal oxide, metal silicate, metal aluminate or metal mixed-aluminate/silicate include, for example, hafnium, zirconium, yttrium, cerium, tantalum, titanium, lanthanum, tungsten, bismuth, barium, strontium, scandium, niobium or lead, or mixtures thereof. Other metal oxides which, when combined with one or more other metal oxides, silicon dioxide or aluminum oxide, or mixtures thereof, yield a dielectric material having a K value greater than about 10 may be suitable. In one embodiment, the mixed-metal oxide, metal silicate, metal aluminate or metal mixed-aluminate/silicate is one which substantially does not react with silicon (or polysilicon or polysilicon-germanium) at temperatures of about 600° C. to about 800° C.

As used herein, the term "polysilicon-germanium" refers to a mixture of polysilicon and germanium, in which the germanium content varies from slightly more than zero up to about 60% by weight by the mixture. Thus, the amount of germanium may range from a doping amount up to about 60% by weight, of the mixture. The polysilicon-germanium may be formed by any method known in the art, i.e., by doping polysilicon with germanium, or by co-deposition, for example.

Although the following process steps are described in terms of silicon dioxide as the bottom oxide layer 28, it is to be understood that any of the foregoing materials may be used, and similar methods may be applied in forming a bottom oxide layer 28 in accordance with the present invention.

Formation of Bottom Oxide Layer and Treatment to Reduce Oxygen Vacancy Content

Figure 2:
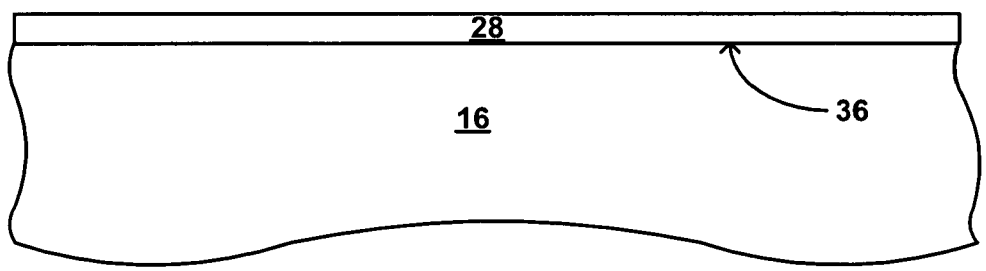
FIGS. 2–6 illustrate, in cross-section, process steps for the fabrication of an ONO structure and a gate structure thereover in accordance with the invention.

Referring to FIG. 2, in the second step of the present invention, shown schematically in FIG. 7 as step 702, a bottom oxide layer 28 having a first oxygen vacancy content is formed on a surface 36 of the semiconductor substrate 16. In one embodiment, the surface 36 is the upper surface of a single crystal silicon substrate. In one embodiment, the surface 36 previously has been processed to remove contaminants and native oxide. A suitable pre-clean procedure includes cleaning the surface with a dilute solution of hydrofluoric acid or any standard cleaning procedure used in the semiconductor industry.

In one embodiment, the bottom oxide layer 28 is formed by oxidation of the surface 36 of the semiconductor substrate 16. The oxidation may be carried out by any appropriate oxidation process known in the art for forming a silicon dioxide bottom oxide by oxidation of a silicon surface. The oxidation may be carried out, for example, in a rapid thermal process (RTP) apparatus. The RTP apparatus may be any such apparatus known in the art. In one embodiment, the RTP apparatus is part of a single-wafer cluster tool.

In one embodiment, the oxidation of the surface 36 is carried out by placing a wafer in the RTP apparatus and flowing an oxygen-containing gas, together with other appropriate gases, into the chamber at suitable flow rates and pressure. The temperature of the RTP can be in the range from about 800° C. to about 1100° C. The flow rates and temperature maybe suitably selected to provide rapid oxidation of the silicon surface, to form an oxide layer of desired thickness. In one embodiment, the oxygen-containing gas is oxygen gas, $O_2$. In another embodiment, the oxygen-containing gas is nitrous oxide, $N_2O$. In another embodiment, the oxygen-containing gas is nitric oxide, NO. The oxidation of the silicon surface continues for a period sufficient to provide a desired thickness of the bottom oxide layer 28. In one embodiment, the oxidation continues for a period in the range from about 5 seconds to about 500 seconds. In one embodiment, the oxidation continues for a period from about 30 to about 120 seconds.

Here and throughout the specification and claims, the limits of the disclosed ranges and ratios may be combined. Thus, for example, it is intended that the foregoing disclosed time ranges also include ranges from about 5 seconds to about 120 seconds and from about 30 seconds to about 500 seconds, although these ranges are not explicitly set forth.

In one embodiment, the bottom oxide layer 28 maybe formed by thermally oxidizing the surface 36 of the substrate 16 at an elevated temperature in the presence of dry molecular oxygen. In one embodiment, the thermal oxidation is carried out at a temperature in the range of about 600° C. to about 900° C. The thermal oxidation process may be carried out in either a batch-type thermal oxidation furnace, or alternatively, in a single-wafer oxidation apparatus. In one embodiment, the thermal oxidation is carried out in the same RTP apparatus as that in which the other steps of the present process are carried out. In one embodiment, the RTP apparatus is part of a single-wafer cluster tool.

In one embodiment, the step of forming the bottom oxide layer 28 is carried out by rapid thermal oxidation (RTO) of the surface 36 at a temperature of about 1100° C. in an oxidizing atmosphere. In one embodiment, the bottom oxide layer 28 may be grown by an RTO of the surface 36 at an elevated temperature in the presence of dry molecular oxygen. In one embodiment, the thermal oxidation is carried out at a temperature in the range of about 1050° C. to about 1150° C., and in one embodiment, from about 1075° C. to about 1125° C. The thermal oxidation process may be carried out in either a batch-type thermal oxidation furnace, or alternatively, in a single-wafer oxidation apparatus. In one embodiment, the thermal oxidation is carried out in the same RTP apparatus as that in which the other steps of the present process are carried out. In one embodiment, the RTP apparatus is part of a single-wafer cluster tool. The oxygen content in the apparatus may range from about 1 to about 20 volume percent.

In one embodiment, the RTO is conducted in an atmosphere comprising oxygen and from about 4 to about 15 volume percent ozone at a temperature of at least about 850° C., up to about 1100° C., and in one embodiment between about 900° C. to about 1000° C. In one embodiment, the oxygen stream contains from about 3 to about 8 volume percent ozone, in another embodiment, from about 4 to about 7 volume percent ozone, and in another embodiment, from about 5 to about 6 volume percent ozone. The atmosphere in the RTO chamber may also contain small amounts of one or more other materials known in the art to enhance the rate of silicon oxidation. Such materials include, for example, chlorine (e.g., HCl, $Cl_2$, etc.), water, etc. If employed, such materials are generally employed in their conventional amounts (e.g., when HCl is employed, it is generally employed up to about 2.5 volume percent HCl).

In one embodiment, in the RTO, the substrate 16 is held in the chamber at the selected temperature for a period ranging from about 10 seconds to about 100 seconds. As will be understood, the time varies depending on the temperature, the gases used, the nature of the substrate 16, the thickness of the bottom oxide layer 28 desired to be formed, and other factors known to those of skill in the art. For example, higher temperatures and higher contents of ozone and/or other oxidation enhancing agents generally require shorter times.

As a result of the RTO process, a bottom oxide layer 28 of a nascent ONO structure is formed on the surface of the semiconductor substrate 16 to form a bottom oxide layer having the first oxygen vacancy content.

In one embodiment, the bottom oxide layer 28 is formed by a deposition process on the surface 36. In one embodiment, the bottom oxide layer 28 is formed by an RTCVD process. In one embodiment, the RTCVD deposition is carried out in the same RTP apparatus as that in which the other steps of the present process are carried out. In one embodiment, the RTP apparatus is part of a single-wafer cluster tool. The bottom oxide can also be formed by depositing the oxide in a batch furnace by an LPCVD process.

In one embodiment, the bottom oxide layer 28 has a thickness of about 20 to about 150 angstroms, and in another embodiment, the bottom oxide layer 28 has a thickness of about 100 angstroms.

In other embodiments, other known methods may be used for depositing the bottom oxide layer comprising the first oxygen vacancy content.

As a result of the foregoing step 702, by an appropriate method, the bottom oxide layer 28 is formed having a first oxygen vacancy content. In one embodiment, the oxygen vacancy content of the bottom oxide layer 28 is substantially stoichiometric, that is, the oxide has substantially the formula $SiO_2$, except that it includes a number of oxygen vacancies. The oxygen vacancy content is that which is normally obtained by a conventional oxide formation or deposition, such as described in the foregoing. In one embodiment, the bottom oxide layer 28 so formed includes a number of oxygen vacancies. In one embodiment, the oxygen content of the bottom oxide layer 28 is sub-stoichiometric, i.e., it is depleted in oxygen content relative to the theoretical stoichiometric formula $SiO_2$. Thus, in one embodiment, the oxide may have a chemical formula which could be expressed as $SiO_x$, wherein x<2, and in another embodiment, $SiO_x$, wherein x is in the range from about 1.9 to about 1.99, and in another embodiment, wherein x is in the range from about 1.8 to about 1.99. In a stoichiometric embodiment, x=2. Thus, the first oxygen vacancy content may be expressed as equal to or less than a stoichiometric oxygen content for $SiO_2$. Such stoichiometric or sub-stoichiometric embodiments include a number of oxygen vacancies.

Although an exactly stoichiometric oxygen content may be expected to include no oxygen vacancies, the stoichiometric content generally relates to the average oxygen content. As will be recognized, while an average oxygen content may be substantially stoichiometric, oxygen vacancies may still be present in the bottom oxide layer 28 if the layer contains a non-uniform oxygen distribution. As noted, the present invention is primarily concerned with oxygen vacancies in the entirety of the bottom oxide layer. Thus, it should be understood that although the bottom oxide layer 28 may have a substantially stoichiometric oxygen content overall, it may nevertheless include an undesirable number of oxygen vacancies.

In embodiments in which a high-K dielectric material is used as the bottom oxide, a similar oxygen vacancy content may exist, and the oxygen vacancy content may be reduced by application of the oxygen content-increasing methods disclosed herein for the reduction of oxygen vacancy content in the high-K dielectric material bottom oxide layer 28.

In the next step of this embodiment, shown schematically in FIG. 7 as step 703, the bottom oxide layer 28 having a first oxygen vacancy content is treated to reduce the oxygen vacancy content from the first oxygen vacancy content to a second, lower oxygen vacancy content and to increase the overall oxygen content, in one embodiment to increase the oxygen content to a super-stoichiometric oxygen content. The reduction in oxygen vacancy content may be accomplished by any of several different methods, briefly summarized in the following. Each of three methods are briefly described in the following: oxygen implantation, reactive oxygen annealing, and a combination of (a) a decoupled plasma oxidation, and (b) annealing in an atmosphere comprising oxygen and at least one inert gas, such as Ar or $N_2$. Other known methods for increasing the oxygen content of oxide materials maybe used, within the scope of the present invention.

Figure 3:
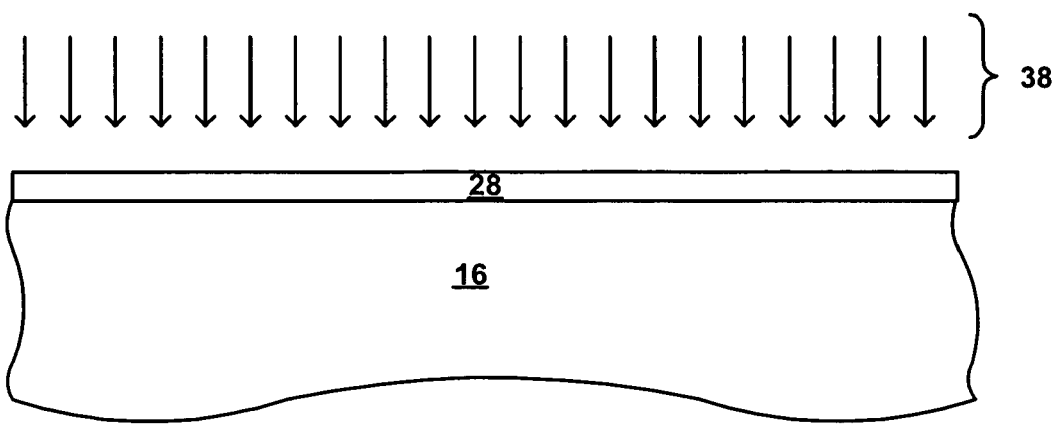

FIG. 3 schematically illustrates treating the bottom oxide layer to reduce the first oxygen vacancy content to a second, lower oxygen vacancy content, by addition of oxygen, shown schematically by arrows 38. The arrows 38 illustrate oxygen atoms or ions being added to the bottom oxide layer 28 by an appropriate method, such as one of the methods described in the following.

In one embodiment, the step of treating the bottom oxide layer comprises an oxygen implantation. In one embodiment, the oxygen implantation is by at least one of an ion implantation or a plasma implantation. In one embodiment, the oxygen implantation is by an ion implantation. In one embodiment, the oxygen implantation is by a plasma implantation.

In the ion implantation, ions of oxygen are implanted by a suitable ion implantation device so that the oxygen is implanted in the bottom oxide layer 28, thereby reducing the number of oxygen vacancies substantially uniformly throughout the thickness of the bottom oxide layer 28. In one embodiment, the implantation is followed by an annealing step.

As is known in the art, advantages of implantation include the ability to exactly control the quantity of implanted ions, in this case oxygen ions, and the ability to select and control the depth of implantation. Both of these advantages can be exploited in the present invention, since it is desired to add a relatively limited quantity of oxygen through the entire thickness of the bottom oxide layer 28, so as to increase the oxygen content, and to reduce the oxygen vacancy content, of the bottom oxide layer 28 from the first oxygen vacancy content to the second, lower oxygen vacancy content.

In the plasma implantation, the oxygen ions are implanted generally throughout the thickness of the bottom oxide layer 28. Following the implantation, the annealing step causes the implanted oxygen to migrate, increasing the likelihood that a given oxygen atom will encounter and "destroy" or eliminate an oxygen vacancy, thus increasing the oxygen vacancy content from the first to the second oxygen vacancy content. As is known, the plasma implantation operates at somewhat lower energies than ion implantation, so may be more useful for relatively thin oxide layers. In one embodiment, the implant energy may generally range from about 5 keV to about 25 keV. In another embodiment, the implant energy is from about 2 KeV to about 10 KeV.

In one embodiment, the plasma implantation uses Plasma Doping (PLAD) systems for implanting oxygen into the bottom oxide layer 28. In a PLAD system, a semiconductor wafer is placed on a conductive platen located in a chamber, and the platen functions as a cathode. An ionizable gas, in this case oxygen, is introduced into the chamber, and a high voltage pulse is applied between the platen and an anode (or the chamber walls), causing the formation of a plasma having a plasma sheath in the vicinity of the wafer. The applied voltage causes ions in the plasma to cross the plasma sheath and to be implanted into the wafer. The depth of implantation is related to the voltage applied between the wafer and the anode.

In another embodiment, other types of plasma implantation systems, such as Plasma-Source Ion Implantation, or Plasma-Immersion Ion implantation, may be used. In these plasma systems, a separate plasma source is used to provide a continuous plasma. In such systems, the platen and the wafer are immersed in a continuous plasma and at intervals, a high voltage pulse is applied between the platen and the anode, causing positive ions in the plasma to be accelerated toward the wafer.

In another embodiment, a pulsed plasma system may be used. A pulsed plasma doping system separates the plasma ignition function from the ion implantation function. An ignition voltage pulse is supplied to an ionizable gas (in this case oxygen) and an implantation voltage pulse is applied to the target. The implantation voltage pulse can be generated from the ignition voltage pulse or can be generated separately from the ignition voltage pulse. In this embodiment, oxygen ions may be implanted in the target at lower energy levels, thus providing enhanced control to the treatment process.

In one embodiment, the step of treating the bottom oxide layer 28 comprises annealing in an atmosphere comprising one or more of ozone, nitric oxide or nitrous oxide. In one embodiment, the annealing is in an atmosphere comprising nitrous oxide, and is carried out at a temperature in the range from about 600° C. to about 1100° C. In another embodiment, the annealing is in an atmosphere comprising nitric oxide, and is carried out at a temperature in the range from about 400° C. to about 1100° C. In another embodiment, the annealing is in an atmosphere comprising ozone, and is carried out at a temperature in the range from about 400° C. to about 800° C.

In one embodiment, the annealing is carried out in a high density plasma comprising a reactive oxygen compound. In one embodiment, the reactive oxygen compound comprises one or more of ozone, nitric oxide or nitrous oxide. In one embodiment, the high density plasma annealing treatment is at a temperature in the range from about 400° C. to about 500° C. In one embodiment, the plasma power is between about 1000 to about 5000 watts (W). In one embodiment, the chamber pressure is between about 5 and about 100 Torr. The plasma anneal may be carried out for a time between about 0.5 and about 5 minutes. The flow rate of ozone, nitric oxide and/or nitrous oxide may be appropriately selected.

The annealing in one or more of ozone, nitric oxide or nitrous oxide causes oxygen to enter the bottom oxide layer 28, and causes the oxygen to be dispersed throughout the bottom oxide layer 28, thus reducing the oxygen vacancy content from the first to the second oxygen vacancy content.

In one embodiment, the step of treating the bottom oxide layer 28 comprises (a) a decoupled plasma oxidation, and (b) annealing in an atmosphere comprising oxygen and at least one inert gas, such as Ar or $N_2$. Other inert gases may be used, such as He, Ne or Kr. In one embodiment, (a) and (b) are sequentially repeated from two to about five times. In this embodiment, the steps both result in additional oxygen entering the bottom oxide layer 28, and the second step also anneals the layer to cause the oxygen to be distributed throughout the bottom oxide layer 28, thus to fill any oxygen vacancies and to react with any hydrogen present, after which water thus formed is forced to exit the layer.

The decoupled plasma in (a) differs from a conventional plasma in that in a decoupled plasma, the power is separated into a source power, which is a high power supplied to the chamber wall, and a bias power which is connected to the wafer. The source power ionizes the gas supplied to the chamber, and generates the reactive species in the chamber. The bias power on the wafer drives the reactive species towards the substrate 16 and thus controls the rate of reaction. Separation of these power sources provides better control of the process, as compared to plasma which uses a single power source both to create the plasma and to drive the generated species to the target.

In one embodiment, the present embodiment of the invention uses a decoupled plasma source (DPS) poly chamber from Applied Materials, Inc., Santa Clara, Calif., for example an Applied Materials AMAT DPS Poly chamber.

Those skilled in the art will realize that power settings, residence times, gas flow rates are equipment specific and will vary from one brand of plasma equipment to another. In general, the gas mixture employed includes oxygen, and may also include argon. The oxygen flow ranges from about 10 standard cubic centimeters per minute (sccm) to about 500 sccm, and in one embodiment, about 250 sccm. In an embodiment including argon, the argon flow may range from about 20 sccm to about 300 sccm, and in one embodiment, about 50 sccm. In one embodiment, the gas pressure in the chamber ranges from about 5 milliTorr (mT) to about 100 mT, and in one embodiment, about 20 mT. The decoupled plasma equipment parameters include a source power of about 400 W to about 2000 W, and in one embodiment, about 1400 W, and a bias power of about 50 W to about 500 W, and in one embodiment, about 200 W. The decoupled plasma may be applied to the bottom oxide layer 28 for a period from about 5 seconds to about 100 seconds, and in one embodiment, for about 30 seconds.

Following application of (a) the decoupled plasma, the bottom oxide layer 28 is (b) annealed in an atmosphere comprising oxygen and at least one inert gas, such as Ar or $N_2$, at a temperature in the range from about 600° C. to about 1100° C., and in one embodiment from about 800° C. to about 950° C., for a period ranging from about 5 seconds to about 5 minutes, and in one embodiment, for a period ranging from about 15 seconds to about 60 seconds. In one embodiment, the ratio of oxygen to the at least one inert gas ranges from about 1:20 to about 1:1, and in another embodiment, the ratio ranges from about 1:10 to about 1:2, and in another, the ratio ranges from about 1:7 to about 1:5. The annealing step (b) disperses the oxygen throughout the thickness of the bottom oxide layer 28, thereby reducing the oxygen vacancy content from a first oxygen vacancy content to a second, lower oxygen vacancy content. In this embodiment, the oxygen may be present as one or more of oxygen ($O_2$), ozone ($O_3$), nitric oxide (NO), nitrous oxide ($NO_2$), or other suitable sources of reactive oxygen.

In one embodiment, steps (a) and (b) are alternately repeated from two to about five times, as deemed necessary by the person of ordinary skill in the art. Although not to be bound by theory, the decoupled plasma step (a) may be considered to primarily increase the overall oxygen content, while the annealing step (b) may be considered to primarily reduce the oxygen vacancy content.

In one embodiment, the bottom oxide layer 28 is a single, relatively uniform layer, and there is no additional layer having a higher oxygen content (or lower oxygen vacancy content) formed on the bottom oxide layer 28. Rather, the entire bottom oxide layer 28 is treated to increase the oxygen content and reduce the oxygen vacancy content. In one embodiment, prior to treatment of the bottom oxide layer 28 to increase the oxygen content and reduce to the oxygen vacancy content, there is no step of applying a current to the layer in an attempt to cause the vacancies to "migrate" in a selected direction. Since the entire bottom oxide layer 28 is treated, there is no need to attempt to relocate oxygen vacancies to a more convenient location. In one embodiment, the treatment step does not include applying a dilute steam ambient to provide preferential oxidation at an interface of the bottom oxide layer 28 with any other layer. Since the entire bottom oxide layer 28 is treated to increase the oxygen content and reduce the oxygen vacancy content, there is no need to treat only portions or to form additional layers or sub-layers.

The foregoing methods of treating the bottom oxide layer 28 to reduce the first oxygen vacancy content to a second, lower oxygen vacancy content, in step 703, are intended to be exemplary and non-limiting. A person of skill in the art may recognize or be aware of additional methods for carrying out this treatment.

In one embodiment, a bottom oxide layer 28 having a first oxygen vacancy content, as described above, has an oxygen vacancy content of about $10^{12}/cm^2$. In another embodiment, the bottom oxide layer 28 having a first oxygen vacancy content, as described above, has an oxygen vacancy content in a range from about $5\times10^{11}/cm^2$ to about $10^{13}/cm^2$. In one embodiment, a bottom oxide layer 28 having a second, reduced oxygen vacancy content, as described above, has an oxygen vacancy content of about $10^{10}/cm^2$ or less. In one embodiment, the bottom oxide layer 28 having a second, reduced oxygen vacancy content, as described above, has an oxygen vacancy content in the range from about $5\times10^{10}/cm^2$ to about $10^9/cm^2$. In one embodiment, the bottom oxide layer 28 having a second, reduced oxygen vacancy content, as described above, has substantially zero oxygen vacancies. As used herein, the term "substantially zero oxygen vacancies" means that any oxygen vacancies which may be present are not detectable, and/or have substantially no discernible effect on the function of the device.

Formation of Bottom Oxide Layer Having Super-Stoichiometric Oxygen Content and a Low or Substantially Zero Oxygen Vacancy Content in a Strongly Oxidizing Process.

In one embodiment, shown schematically in FIG. 8 as step 802, the bottom oxide layer 28 is formed by methods including strongly oxidizing conditions, which provide a super-stoichiometric oxygen content and a reduced or low, or in one embodiment, a substantially zero, oxygen vacancy content, in the initially formed bottom oxide layer 28. Thus, in such embodiments, it is not necessary to add or carry out a subsequent treatment step in order to increase the oxygen content and reduce the oxygen vacancy content, since the strongly oxidizing conditions result in formation of a bottom oxide layer 28 in which the oxygen content already is increased to super-stoichiometric level, and the oxygen vacancy content is already reduced, or in one embodiment, the oxygen vacancy content is substantially zero, when the bottom oxide layer 28 is formed. Due to the strongly oxidizing conditions employed in these embodiments, a super-stoichiometric oxygen content and a low, reduced or substantially zero oxygen vacancy content may be obtained in the bottom oxide layer 28. Thus, in one embodiment, the oxide may have a chemical formula which may be expressed as $SiO_x$, wherein x>2, and in another embodiment, $SiO_x$, wherein x is in the range from about 2.01 to about 2.1. Thus, the oxygen content may be described as greater than the stoichiometric oxygen content for $SiO_2$, and the oxygen vacancy content is reduced from that observed with stoichiometric or sub-stoichiometric silicon dioxide. Such a super-stoichiometric embodiment would include very few if any oxygen vacancies. In one embodiment, the bottom oxide layer 28 as formed by the methods of the present embodiment contains substantially no oxygen vacancies.

In embodiments in which a high-K dielectric material is used as the bottom oxide, a similar oxygen vacancy content can exist, and can be avoided by application of the strongly oxidizing processes disclosed herein to the formation of the high-K dielectric material bottom oxide layer 28.

Thus, in this embodiment, the process for reducing charge leakage in a SONOS flash memory device, includes the steps of providing a semiconductor substrate 16; forming a bottom oxide layer 28 of an ONO structure 24 on a surface 36 of the semiconductor substrate 16 having a reduced oxygen vacancy content of about $10^{10}/cm^2$ or less, and in one embodiment, a bottom oxide layer 28 having an oxygen vacancy content in the range from about $5\times10^{10}/cm^2$ to about $10^9/cm^2$, and in another embodiment, an oxygen vacancy content of substantially zero (that is, not detectable), and in one embodiment, having a super-stoichiometric oxygen content; and depositing a dielectric charge-storage layer 30 on the bottom oxide layer 28. The step of forming the bottom oxide layer 28 under strongly oxidizing conditions, in which the bottom oxide layer 28 is formed having a super-stoichiometric oxygen content and a reduced oxygen vacancy content, is described in more detail in the following. In one embodiment, the bottom oxide layer 28 having a super-stoichiometric oxygen content exhibits a reduced charge leakage relative to a bottom oxide layer having a stoichiometric or sub-stoichiometric oxygen content.

In one embodiment, the step of forming the bottom oxide layer is carried out by decoupled plasma oxidation in an oxidizing atmosphere. Thus, in this embodiment, a decoupled plasma similar to that described above may be employed, with the oxidizing gas flow and concentration, the source and bias power and the reaction times generally in the higher end of the ranges given above with respect to the "oxygen vacancy content reducing" embodiment. In addition to oxygen, or instead of oxygen, the plasma atmosphere used in this embodiment also includes another strongly oxidizing gas such as ozone, nitric oxide and/or nitrous oxide. Thus, in one embodiment, in the decoupled plasma, the oxygen flow ranges from about 100 sccm to about 1000 sccm, and in one embodiment, about 500 sccm. In an embodiment including argon, the argon flow may range from about 20 sccm to about 300 sccm, and in one embodiment, about 50 sccm. In an embodiment including ozone, nitric oxide and/or nitrous oxide in addition to or instead of oxygen, the flow(s) of these gases may range from about 10 sccm to about 1000 sccm each, and in one embodiment about 250 sccm each. In one embodiment, when these gases are combined with oxygen, the flows of oxygen and the ozone and/or nitrous oxide may be adjusted to provide a combined oxidizing gas flow in the range from about 100 sccm to about 1000 sccm. In one embodiment, the gas pressure in the chamber ranges from about 10 mT to about 200 mT, and in one embodiment, about 50 mT. The decoupled plasma equipment parameters include a source power of about 500 W to about 2500 W, and in one embodiment, about 1800 W, and a bias power of about 100 W to about 500 W, and in one embodiment, about 250 W. The decoupled plasma may be applied to form the bottom oxide layer 28 for a period from about 10 seconds to about 150 seconds, and in one embodiment, for about 60 seconds. Persons of skill in the art can select appropriate conditions for the decoupled plasma oxidation to form the bottom oxide layer 28 having a super-stoichiometric oxygen content. As a result of the decoupled plasma oxidation process, a bottom oxide layer 28 of a nascent ONO structure is formed on the surface of the semiconductor substrate 16 to form a bottom oxide layer having a super-stoichiometric oxygen content and a reduced or, in one embodiment, a substantially zero, oxygen vacancy content.

In one embodiment, the step of forming the bottom oxide layer 28 is carried out by remote plasma oxidation in a strongly oxidizing atmosphere. In one embodiment, the remote plasma treatment conditions include forming an oxygen plasma with a flow rate between about 1 to about 100 sccm, an operation temperature in the range of about 450° C. to about 800° C., an operation pressure in the range of about 0.1 to about 2 Torr and a power of about 2000 to about 4000 Watts for about 15 to about 100 seconds. Persons of skill in the art can select appropriate conditions for the remote plasma oxidation to form the bottom oxide layer 28 having a super-stoichiometric oxygen content, based on the foregoing and depending on the particular equipment employed. As a result of the remote plasma oxidation process, a bottom oxide layer 28 of a nascent ONO structure is formed on the surface of the semiconductor substrate 16 having a super-stoichiometric oxygen content and a reduced or, in one embodiment, a substantially zero, oxygen vacancy content.

In one embodiment, the step of forming the bottom oxide layer 28 is carried out by a thermal oxidation comprising ozone as a strong oxidizing agent. In one embodiment, the surface of the substrate 16 is first pre-cleaned with a gas mixture comprising ozone. In this embodiment, any of the foregoing oxidation processes, or a simple thermal oxidation, may be carried out, using ozone as the oxidizing agent, in the absence of other oxidizing agents.

In one embodiment, the ozone oxidation process is performed in a reaction chamber, at a temperature of about 600° C. to about 1300° C., and at atmospheric pressure or less. During the ozone oxidation, ozone and oxygen are mixed in a predetermined ratio, cooled to room temperature or less, and then injected into the reaction chamber. In one embodiment, the ratio of the ozone to oxygen is between about 0.5% to 25% by volume, and in one embodiment, from about 1% to about 10% by volume. In one embodiment, the gas mixture can include steam and a gas such as a halogen or a halogen containing compound which enhances the oxidation process. In general, during the ozone oxidation, ozone ($O_3$) decomposes into diatomic oxygen ($O_2$) and highly reactive monoatomic oxygen (O). This leaves a large number of the highly reactive monoatomic oxygen atoms (O) free and available to combine with silicon to form silicon dioxide ($SiO_2$). As a result of the ozone oxidation process, a bottom oxide layer 28 of a nascent ONO structure is formed on the surface of the semiconductor substrate 16 to form a bottom oxide layer 28 having a super-stoichiometric oxygen content and a reduced or, in one embodiment, a substantially zero, oxygen vacancy content.

In one embodiment, the step of forming the bottom oxide layer 28 is carried out in an oxygen rich ambient, for an extended period, but at a lower temperature. In this embodiment, the bottom oxide layer 28 is grown at a slow rate to form more nearly stoichiometric $SiO_2$ with fewer oxygen vacancies or to form an oxygen-rich $SiO_2$ having a super-stoichiometric oxygen content as a result of the presence of more reactive oxygen species and higher oxygen partial pressure and extended reaction time during $SiO_2$ growth. In this embodiment, the temperature of the oxidation is in a range from about 300° C. to about 800° C., and in one embodiment, from about 600° C. to about 800° C. In one embodiment, the time of the oxidation is in a range from about 10 minutes to about 8 hours. In this embodiment, the oxygen partial pressure is greater than about 21% of the total pressure of the oxidation atmosphere (where the partial pressure of oxygen in normal atmospheric air is about 21%). In one embodiment, the remainder of the atmosphere is Ar, and in another embodiment, HCl, and in another embodiment, a mixture of Ar and HCl. In one embodiment, HCl is not used, in order to avoid addition of H to the bottom oxide layer 28. In another embodiment, the oxygen partial pressure is in a range from about 21% to about 100%, and in another embodiment, in a range from about 25% to about 90%, and in one form about 50% to about 80%. In one embodiment, the oxygen content is about 97% and the remainder of the atmosphere is HCl. The increased oxygen available for oxidation may be obtained by applying higher than atmospheric pressure, by increasing the oxygen content of the atmosphere relative to other gases, or by a combination of these two methods.

In another embodiment, more-reactive oxygen species can be used under the foregoing conditions, such as ozone ($O_3$) or radical oxygen generated by other methods. The ozone or radical oxygen or both may be mixed with oxygen, as above. In one embodiment, the partial pressure of ozone ranges from about 0.1% to about 10%, and in another embodiment, the partial pressure of ozone ranges from about 1% to about 5%. Generation of ozone and radical oxygen species may be by any appropriate method known in the art.

In the foregoing thermal oxidations, in one embodiment, when the oxidation at elevated temperature is complete, the semiconductor device and the reaction chamber are cooled while maintaining the oxidizing atmosphere in the chamber. In one embodiment, steam oxidation is not used, and in one embodiment, water is excluded from the chamber.

In one embodiment, the bottom oxide layer 28 is deposited by a CVD method under oxygen at a high pressure at a temperature of about 400° C. to about 480° C. In one embodiment, the CVD is carried out at a temperature of about 430° C. In one embodiment, the CVD method is a thermal CVD, and in another embodiment, the CVD method is plasma-enhanced CVD(PECVD). Suitable starting materials may be appropriately selected. Suitable methods for carrying out CVD deposition of oxides having an enhanced content of oxygen can be suitably selected by those of skill in the art.

In one embodiment, the bottom oxide layer 28 is formed by ISSG oxidation of a portion of the upper surface of the silicon substrate 16. In one embodiment, the bottom oxide layer 28 is formed by in-situ steam generation (ISSG) oxidation of the silicon surface of the semiconductor substrate 16. The ISSG oxidation of the silicon surface maybe carried out, for example, in a rapid thermal process (RTP) apparatus. The RTP apparatus may be any such apparatus known in the art. In one embodiment, the RTP apparatus is part of a single-wafer cluster tool.

In one embodiment, the ISSG oxidation of the silicon surface is carried out by placing the wafer in the RTP apparatus and flowing a mixture of oxygen-containing gas and hydrogen-containing gas to the chamber at suitable flow rates and pressure. The temperature of the RTP can be in the range from about 800° C. to about 1150° C. The flow rates and temperature may be suitably selected to provide rapid oxidation of the silicon surface 36, to form an oxide layer of desired thickness.

For the ISSG process described above, any of the commercially available RTP systems can be utilized. Additional details and processes for forming an oxide by ISSG oxidation of a silicon substrate are disclosed in commonly assigned, copending U.S. application Ser. No. 10/023,548, filed Dec. 17, 2001, the disclosure of which is hereby incorporated by reference for its teachings relating to ISSG oxidation. As a result of the ozone oxidation process, a bottom oxide layer 28 of a nascent ONO structure is formed on the surface of the semiconductor substrate 16 to form a bottom oxide layer 28 having a super-stoichiometric oxygen content and a reduced or, in one embodiment, a substantially zero, oxygen vacancy content.

Following formation of the bottom oxide layer 28 having had the first oxygen vacancy content reduced to the second oxygen vacancy content in step 703 of FIG. 7, or having been formed with a super-stoichiometric and/or reduced oxygen vacancy content in step 802 of FIG. 8, in accordance with either of the foregoing embodiments, fabrication of the ONO structure, and of the flash memory device, continues.

Figure 4:
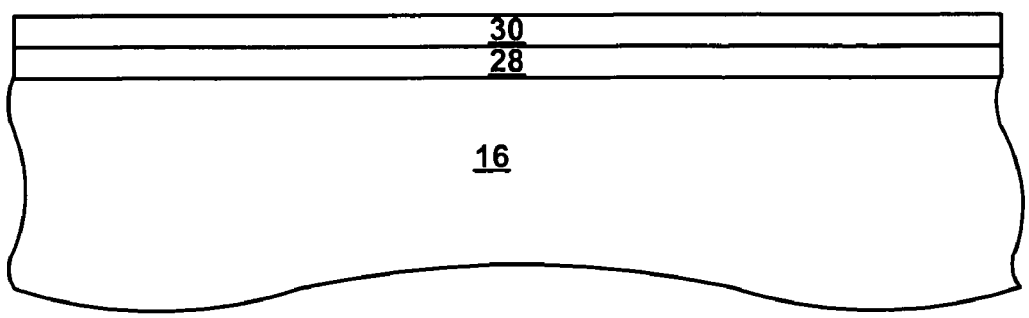

In the next step of the present invention, shown schematically in FIG. 7 as step 704 and in FIG. 8 as step 803, a dielectric charge storage layer 30 is formed on the bottom oxide layer 28. As shown in FIG. 4, after forming the bottom oxide layer 28, the dielectric charge storage layer 30 is deposited on the bottom oxide layer 28. In one embodiment, the dielectric charge storage layer 30 comprises silicon nitride. In another embodiment, the dielectric charge storage layer comprises a high-K dielectric material. In another embodiment, the dielectric charge storage layer 30 comprises both a high-K dielectric material and a standard-K dielectric material, such as silicon nitride. In one embodiment, the dielectric charge storage layer 30 comprises a composite dielectric material, which comprises a composite or a reaction product of two or more dielectric materials, one of which is a high-K dielectric material and the other of which may be a standard-K dielectric material such as silicon nitride. Thus, in one embodiment, the high-K dielectric material completely replaces silicon nitride in the dielectric charge storage layer 30. In another embodiment, the high-K dielectric material is, in essence, added to or combined with, silicon nitride to form a dielectric charge storage layer 30. In another embodiment, the dielectric charge storage layer 30 includes a composite dielectric material which replaces silicon nitride. Suitable high-K dielectric materials for use in a high-K dielectric charge storage layer are disclosed in copending U.S. application Ser. No. 10/036,757, filed Dec. 31, 2001, which is incorporated herein by reference for its disclosure relating to high-K dielectric materials for use in a charge storage layer of an ONO structure. Suitable methods for deposition of a high-K dielectric material layer include RTCVD carried out at a temperature of about 400° C. to about 800° C. The high-K dielectric material may be formed by reacting a suitable metal-containing gas, e.g., hafnium tetra-t-butoxide with a suitable oxygen-containing gas, e.g., oxygen ($O_2$) or nitrous oxide ($N_2O$).

In one embodiment, the high-K dielectric material may be deposited by other chemical vapor deposition (CVD) methods. The CVD method may be any appropriate CVD method known in the art for deposition of a high-K material. For example, the CVD method may be ALD (ALCVD), PECVD, MOCVD or MLD, in addition to the above-mentioned RTCVD.

In one embodiment, the high-K dielectric material includes at least one of hafnium oxide ($HfO_2$), zirconium oxide ($ZrO_2$), tantalum oxide ($Ta_2O_5$), barium titanate ($BaTiO_3$), titanium dioxide ($TiO_2$), cerium oxide ($CeO_2$), lanthanum oxide ($La_2O_3$), lanthanum aluminum oxide ($LaAlO_3$), lead titanate ($PbTiO_3$), silicon titanate ($SiTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), and PST ($PbSc_xTa_{1-x}O_3$). In addition to the foregoing high-K dielectrics, other high-K dielectric materials, for example, ferroelectric high-K dielectric materials such as lead lanthanum titanate, strontium bismuth tantalate, bismuth titanate and barium zirconium titanate may be suitably used in the present invention. Other high-K dielectric materials known in the art, including, for example binary and ternary oxides having K values of about 20 or higher, also may be used in the present invention.

With respect to embodiments in which the dielectric charge storage layer 30 comprises materials other than a nitride, herein the combined structure 24, including the charge storage layer 30 and the two oxide layers 28, 32 between which it is sandwiched, is referred to as an ONO structure, even though the "N" layer may be other than a nitride.

In one embodiment, the charge storage layer 30 is silicon nitride formed by means of a rapid-thermal-chemical-vapor-deposition (RTCVD) process. In one embodiment, the RTCVD process is carried out at a temperature of about 700° C. to about 800° C. The silicon nitride material maybe formed by reacting a suitable nitrogen-containing gas, e.g., ammonia ($NH_3$) with a suitable silicon-containing gas, e.g., dichlorosilane ($SiCl_2H_2$) or silane ($SiH_4$).

In one embodiment, the process is carried out for a period of time and at gas flow rates sufficient to form a silicon nitride layer having a thickness of about 50 to about 200 angstroms. In another embodiment, the process is carried out for a period of time and at gas flow rates sufficient to form a silicon nitride layer having a thickness of about 100 angstroms.

In one embodiment, ammonia is introduced in the RTCVD apparatus at a flow rate of about 1000 sccm and either dichlorosilane or silane is introduced at a flow rate of about 30 to about 50 sccm. The RTCVD process is carried out in three steps including an initial temperature ramp, a deposition step, and cool-down step. In one embodiment, the total reaction time is about 1 to about 3 minutes. In another embodiment, the silicon nitride deposition step is completed in about 2 minutes.

In another embodiment, the charge storage layer 30 is silicon nitride formed by means of a low-pressure-chemical-vapor-deposition (LPCVD) process. In this alternative embodiment, the silicon nitride can be formed in a batch deposition apparatus. In one embodiment, the LPCVD process is carried out at an absolute pressure of about 200 to about 500 mT, at temperatures of about 700° C. to about 800° C. using ammonia and either dichlorosilane or silane gas.

In another embodiment, the dielectric charge storage layer 30 is aluminum oxide, $Al_2O_3$. The aluminum oxide may be deposited by any suitable method, for example by LPCVD. Suitable precursors for CVD include organo-aluminum compounds such as aluminum isopropoxide and aluminum beta-diketonate. The use of various aluminum beta-diketonates in APCVD deposition of aluminum oxide is discussed, for example, in U.S. Pat. No. 6,258,157. A liquid precursor for the CVD of aluminum oxide, triethyldialuminum tri-sec-butoxide, is disclosed in U.S. Pat. No. 6,180,190.

The dielectric charge storage layer 30 may be deposited by other suitable methods known in the art.

Following deposition of the dielectric charge storage layer 30, in the next step of the process of fabricating the flash memory device, shown schematically in FIG. 7 as step 705, and in FIG. 8 as step 804, a top oxide layer 32 is formed on the dielectric charge storage layer 30 by a suitable technique. The top oxide layer 32 may comprise any of the materials disclosed above for the bottom oxide layer 28. For example, the top oxide layer 32 may comprise silicon dioxide, a high-K dielectric material or a composite dielectric material, as defined herein.

As shown in FIG. 5, after depositing the dielectric charge storage layer 30, the top oxide layer 32 is formed on the dielectric charge storage layer 30. The top oxide layer 32 may be formed by any appropriate method known in the art. In one embodiment, when the charge storage material is silicon nitride, the top oxide layer 32 is grown by oxidation of a portion of the silicon nitride layer 30. In another embodiment, the top oxide layer 32 is deposited by an appropriate deposition method.

In one embodiment, the top oxide layer 32 is formed by an HTO deposition, such as the RTCVD or LPCVD methods described above. In one embodiment, the top oxide layer 32 is deposited by another suitable method, such as PECVD, ALD (ALCVD), PLD, MLD or MOCVD. The CVD method may be any appropriate CVD method known in the art.

In one embodiment, the top oxide layer 32 is formed by ISSG oxidation of a part of the upper surface of the dielectric charge storage layer 30, when it is silicon nitride. A process for forming a top oxide by ISSG oxidation of a silicon nitride layer is disclosed in commonly assigned, copending U.S. application Ser. No. 10/023,548, filed Dec. 17, 2001, the disclosure of which is hereby incorporated by reference for its teachings relating to ISSG oxidation.

In one embodiment, in which the deposition of silicon nitride for the charge storage layer 30 is carried out by RTCVD in the RTP apparatus, at the completion of the deposition, when the cool-down step has reduced the temperature to about 400° C. to about 500° C., the apparatus is converted for an ISSG oxidation process without removing the wafer from the apparatus, and without exposing the wafer to the outside atmosphere. Thus, these steps in the fabrication of the SONOS flash memory device may be carried out sequentially in a single apparatus, without removing the wafer from the apparatus between the charge storage layer 30 formation steps and the top oxide layer 32 formation steps.

As shown in FIG. 6, following formation of the ONO structure 24 in accordance with the present invention, shown schematically in FIG. 7 as step 706, and in FIG. 8 as step 805, a layer forming a control gate electrode 22 is formed on the top oxide layer 32. The stacked-gate structure shown in FIG. 1 is completed by depositing a layer of gate forming material overlying the top oxide layer 32. A lithographic patterning and etching process may then be carried out to define the stacked gate structure shown in FIG. 1, including the control gate electrode 22 and the ONO structure 24. Those skilled in the art will recognize that various gate-forming materials can be used to fabricate the control gate electrode 22. For example, the control gate electrode 24 can be formed with polycrystalline silicon, silicon-germanium, amorphous silicon, a refractory metal silicide, a metal, and the like.

Following formation of the control gate electrode 22 and the ONO structure 24, fabrication of the semiconductor device continues, as indicated in the final step of FIGS. 7 and 8. For example, the sidewall isolation structures 26, the first and second bit line oxide regions 20, and the source 12 and drain 14, may be formed.

There has been disclosed in accordance with the invention a process for fabricating an ONO floating-gate electrode, for example for use in a MIRRORBIT™ dual-bit EEPROM device, that fully provides the advantages set forth above. As noted above, the process of the invention may also be applicable to forming the ONO structure in a floating gate FLASH device.

INDUSTRIAL APPLICABILITY

The present invention, by use of a process either to reduce the oxygen vacancy content of a bottom oxide layer, or to form a bottom oxide layer having a super-stoichiometric oxygen content and a reduced, or in one embodiment, substantially zero, oxygen vacancy content in the bottom oxide layer, a semiconductor device including an ONO structure may be fabricated without creation of interface states that could provide charge leakage paths from the dielectric charge storage layer of the ONO structure. The present invention provides advantages such as (1) formation of a bottom oxide layer with a higher oxygen content and a reduced oxygen vacancy content, reduced numbers of E' centers and dangling bonds; (2) allowing selection of any of a number of different methods for obtaining advantage (1); (3) a lower thermal budget; (4) formation of a bottom oxide layer having fewer interface states that could provide charge leakage paths; and (5) formation of an ONO structure with improved charge storage capability. Thus, the present invention provides an advance in ONO fabrication technology, and insures proper charge isolation in ONO structures used in MIRRORBIT™ dual-bit EEPROM devices, while at the same time providing distinct process and economic advantages. Although described in terms of, and particularly applicable to, dual-bit EEPROM devices, the present invention is broadly applicable to fabrication of any semiconductor device including an ONO structure.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the thicknesses of the individual layers making up the ONO structure can be varied from that described herein. It is therefore intended to include within the invention all such variations and modifications that fall within the scope of the appended claims and equivalents thereof.

What is claimed is:

1. A SONOS flash memory device, comprising:
 a semiconductor substrate;
 an ONO structure formed on the semiconductor substrate, the ONO structure comprising a bottom oxide layer, a dielectric charge storage layer and a top oxide layer, the bottom oxide layer having a super-stoichiometric oxygen content and an oxygen vacancy content of about $10^{10}/cm^2$ or less, wherein the bottom oxide layer exhibits a reduced charge leakage relative to a bottom oxide layer having a stoichiometric or sub-stoichiometric oxygen content and a greater number of oxygen vacancies.

2. The SONOS flash memory device of claim 1 wherein the bottom oxide layer comprises a high-K dielectric material.

3. The SONOS flash memory device of claim 2 wherein the high-K dielectric material comprises one or more of $ZrO_2$; $HfO_2$; $Al_2O_3$; $Y_2O_3$; $La_2O_3$; a silicate of one or more of $ZrO_2$, $HfO_2$, $Al_2O_3$, $Y_2O_3$, $La_2O_3$; or an aluminate of one or more of $ZrO_2$, $HfO_2$, $Y_2O_3$, $La_2O_3$; tantalum oxide ($Ta_2O_5$); barium titanate ($BaTiO_3$); titanium dioxide ($TiO_2$); cerium oxide ($CeO_2$); lanthanum aluminum oxide ($LaAlO_3$); lead titanate ($PbTiO_3$); strontium titanate ($SrTiO_3$); lead zirconate ($PbZrO_3$); tungsten oxide ($WO_3$); bismuth silicon oxide ($Bi_4Si_2O_{12}$); barium strontium titanate (BST) ($Ba_{1-x}Sr_xTiO_3$); PMN ($PbMg_xNb_{1-x}O_3$); PZT ($PbZr_xTi_{1-x}O_3$); PZN ($PbZn_xNb_{1-x}O_3$); PST ($PbSc_xTa_{1-x}O_3$); lead lanthanum titanate; strontium bismuth tantalate; bismuth titanate; and barium zirconium titanate.

4. The SONOS flash memory device of claim 2 wherein the high-K dielectric material is other than tantalum oxide, $Ta_2O_5$.

5. The SONOS flash memory device of claim 1 wherein the bottom oxide comprises a composite dielectric material.

6. The SONOS flash memory device of claim 1 wherein the bottom oxide layer comprises $SiO_x$, wherein x>2.

7. The SONOS flash memory device of claim 1 wherein the charge storage layer is a nitride charge storage material.

8. The SONOS flash memory device of claim 7 wherein the charge storage layer comprises silicon nitride.

9. A SONOS flash memory device, comprising:
 a semiconductor substrate;
 an ONO structure formed on the semiconductor substrate, the ONO structure comprising a bottom oxide layer, a dielectric charge storage layer and a top oxide layer, the bottom oxide layer having a super-stoichiometric oxygen content and an oxygen vacancy content of substantially zero, wherein the bottom oxide layer exhibits a reduced charge leakage relative to a bottom oxide layer having a stoichiometric or sub-stoichiometric oxygen content and a substantial number of oxygen vacancies.

10. The SONOS flash memory device of claim 9 wherein the bottom oxide layer comprises a high-K dielectric material.

11. The SONOS flash memory device of claim 10 wherein the high-K dielectric material comprises one or more of $ZrO_2$; $HfO_2$; $Al_2O_3$; $Y_2O_3$; $La_2O_3$; a silicate of one or more of $ZrO_2$, $HfO_2$, $Al_2O_3$, $Y_2O_3$, $La_2O_3$; or an aluminate of one or more of $ZrO_2$, $HfO_2$, $Y_2O_3$, $La_2O_3$; tantalum oxide ($Ta_2O_5$); barium titanate ($BaTiO_3$); titanium dioxide ($TiO_2$); cerium oxide ($CeO_2$); lanthanum aluminum oxide ($LaAlO_3$); lead titanate ($PbTiO_3$); strontium titanate ($SrTiO_3$); lead zirconate ($PbZrO_3$); tungsten oxide ($WO_3$); bismuth silicon oxide ($Bi_4Si_2O_{12}$); barium strontium titanate (BST) ($Ba_{1-x}Sr_xTiO_3$); PMN ($PbMg_xNb_{1-x}O_3$); PZT ($PbZr_xTi_{1-x}O_3$); PZN ($PbZn_xNb_{1-x}O_3$); PST ($PbSc_xTa_{1-x}O_3$); lead lanthanum titanate; strontium bismuth tantalate; bismuth titanate; and barium zirconium titanate.

12. The SONOS flash memory device of claim 10 wherein the high-K dielectric material is other than tantalum oxide, $Ta_2O_5$.

13. The SONOS flash memory device of claim 9 wherein the bottom oxide comprises a composite dielectric material.

14. The SONOS flash memory device of claim 9 wherein the bottom oxide layer comprises $SiO_x$, wherein x>2.

15. The SONOS flash memory device of claim 9 wherein the charge storage layer is a nitride charge storage material.

16. The SONOS flash memory device of claim 15 wherein the charge storage layer comprises silicon nitride.

17. A SONOS flash memory device, comprising:
 a semiconductor substrate;
 an ONO structure formed on the semiconductor substrate, the ONO structure comprising a bottom oxide layer, a nitride charge storage layer and a top oxide layer, the bottom oxide layer having a super-stoichiometric oxygen content and an oxygen vacancy content of about $10^{10}/cm^2$ or less, wherein the bottom oxide layer exhibits a reduced charge leakage relative to a bottom oxide layer having a stoichiometric or sub-stoichiometric oxygen content and a greater number of oxygen vacancies,
 wherein the bottom oxide layer comprises silicon dioxide, a high-K dielectric material or a composite dielectric material.

18. The SONOS flash memory device of claim 17 wherein the charge storage layer comprises silicon nitride.

19. The SONOS flash memory device of claim 17 wherein the silicon dioxide has a formula $SiO_x$, wherein x>2.

20. The SONOS flash memory device of claim 17 wherein the high-K dielectric material comprises one or more of $ZrO_2$; $HfO_2$; $Al_2O_3$; $Y_2O_3$; $La_2O_3$; a silicate of one or more of $ZrO_2$, $HfO_2$, $Al_2O_3$, $Y_2O_3$, $La_2O_3$; or an aluminate of one or more of $ZrO_2$, $HfO_2$, $Y_2O_3$, $La_2O_3$; tantalum oxide ($Ta_2O_5$); barium titanate ($BaTiO_3$); titanium dioxide ($TiO_2$); cerium oxide ($CeO_2$); lanthanum aluminum oxide ($LaAlO_3$); lead titanate ($PbTiO_3$); strontium titanate ($SrTiO_3$); lead zirconate ($PbZrO_3$); tungsten oxide ($WO_3$); bismuth silicon oxide ($Bi_4Si_2O_{12}$); barium strontium titanate (BST) ($Ba_{1-x}Sr_xTiO_3$); PMN ($PbMg_xNb_{1-x}O_3$); PZT ($PbZr_xTi_{1-x}O_3$); PZN ($PbZn_xNb_{1-x}O_3$); PST ($PbSc_xTa_{1-x}O_3$); lead lanthanum titanate; strontium bismuth tantalate; bismuth titanate; and barium zirconium titanate.

\* \* \* \* \*